United States Patent [19]

Delfino

[11] Patent Number: 4,549,064
[45] Date of Patent: Oct. 22, 1985

[54] LASER TREATMENT OF SILICON NITRIDE

[75] Inventor: Michelangelo Delfino, Los Altos, Calif.

[73] Assignee: Fairchild Camera & Instrument Corp., Mt. View, Calif.

[21] Appl. No.: 482,122

[22] Filed: Apr. 5, 1983

[51] Int. Cl.[4] .............................................. B23K 26/00
[52] U.S. Cl. ...................... 219/121 LM; 219/121 LF
[58] Field of Search ..... 219/121 L, 121 LM, 121 LE, 219/121 LF; 148/1.5, 187; 357/50, 3, 91

[56] References Cited

U.S. PATENT DOCUMENTS 4,341,569 7/1982 Yaron et al. ............. 219/121 LF X

FOREIGN PATENT DOCUMENTS 46523 4/1981 Japan .

*Primary Examiner*—C. L. Albritton
*Attorney, Agent, or Firm*—Thomas S. MacDonald; Carl Silverman; David H. Carroll

[57] ABSTRACT

An argon-fluorine (ArF) excimer laser is used to selectively heat various $Si_3N_4$ materials used in the manufacture of semiconductor devices to elevated temperatures while maintaining active device regions and electrical interconnects at relatively low temperatures, to, for example, anneal the structural layer, induce compositional changes or densification and/or flow of the silicon nitride-based material to round off sharp edges and stops, all without damaging or appreciably affecting the active regions and electrical interconnects of a semiconductor device.

13 Claims, 1 Drawing Figure

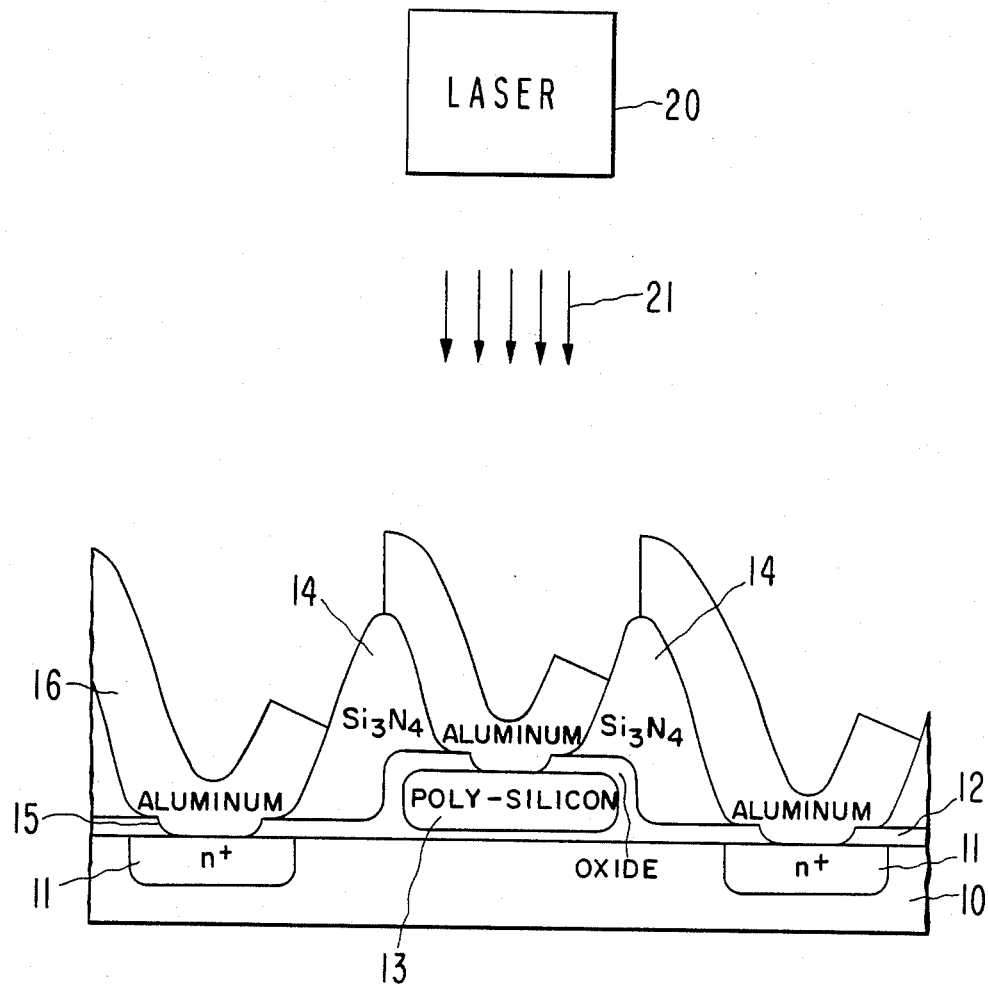

LASER TREATMENT OF SILICON NITRIDE

BACKGROUND OF THE INVENTION

1. Field of the Invention

This invention relates to heating or annealing of silicon nitride based material in the semiconductor art such as in integrated circuits.

2. Prior Art

In the manufacture of miniature electronic devices such as semiconductor integrated circuits including metal oxide semiconductors (MOS), it is frequently desired to establish electrical interconnections between two parts of the device by means of a conductive film making contact to the parts to be interconnected. Typically, this conducting film has a portion that overlies an insulating material layer and makes contact though small apertures in the insulator (e.g. silicon dioxide) to the underlying device portion (e.g. silicon). In addition, it is often desirable that this conducting film cross other films, which might be conducting, insulating or semi-conducting. To accomplish this, conductive film (e.g. aluminum) is vacuum evaporated or otherwise deposited atop the device structure and photoengraved to leave a desired pattern of conductors.

The sequential film-forming and photoengraving processes utilized to construct the underlying device structure generally result in the occurrence of variations of height, comparable to the thicknesses of the films involved. Certain of these changes in surface elevation can have very steep, or even overhanging edges. These edges can act as stress-concentrating regions and can result in occurrence of cracks in the conducting film that must traverse them. Such cracks are extremely deleterious. They can cause low production yield and can result in products that have high rates of failure in use.

One solution of this problem (U.S. Pat. No. 3,825,442—Moore) is to place the device in a furnace for a predetermined period of time at an elevated temperature until the insulating material flows to form a smooth surface topography around the apertures. Extreme care must be taken to avoid having the whole device heated to high temperatures which can cause migration of dopants, alloying, contaminating or other compositional charges.

An improved solution proposed by applicant in continuation application U.S. Ser. No. 339,600 filed Jan. 15, 1982 has been to employ a laser beam to induce densification or flow of phosphosilicate glass used as insulator layers in semiconductor devices. This process utilizes the absorption coupling of a laser beam tuned to selectively excite and thus preferential heat the $SiO_2$-based layer rather than surrounding strata of silicon substrate and interconnect regions. U.S. Pat. No. 4,284,659 (Jaccodine et al.) also disclose high energy laser radiation selectively coupled to a glass dielectric layer i.e. phosphorous doped silicon glass, deposited by the well-known chemical vapor deposition process. A continuous wave $CO_2$ laser having a wavelength of 10.6 $\mu$m with a dwell time on the layer being worked of 1 msec is employed. U.S. Pat. No. 4,316,074 (Daly) shows a method and apparatus and discusses other prior art with respect to each annealing of semiconductor materials. It includes much on the physics and theory of the operation, involving primarily a Nd:YAG (neodymium-doped yttrium aluminum garnet laser in the cw-pumped, Q-switched configuration usable in a scanning mode.

Also various semiconductor devices include the use of silicon nitride ($Si_3N_4$) layers and regions for the purpose of passivation, isolation, gate dielectric, high dielectric contact capacitors, etc. Since the flow and annealing temperature of $Si_3N_4$ is greater than $SiO_2$ the aforementioned furnace annealing process cannot be utilized except at temperatures of at least 950° C. for periods of about 30 minutes to aneal, densify or to induce compositional changes in $Si_3N_4$, in the presence of other integrated circuit device materials such as silicon, silicon dioxide and aluminum. Flow requires temperatures exceeding 1200° C. These temperatures and times may well cause dopant migration in the other layers and melting of aluminum layers which have a melting point of 660° C., or which will alloy with silicon at 577° C. The laser disclosed in the '659 patent has no utility for silicon nitride treatment. Accordingly, there is a need to develop a selective heating process for coupling radiation to $Si_3N_4$ layers in semiconductor devices which can effectively treat silicon nitride at elevated temperatures to anneal, flow, densify and induce compositional changes, with minimal heat conduction into other portions of the structure, such as the surrounding or underlying layers.

SUMMARY OF THE INVENTION

The present method utilizes laser radiation from an ArF (argon fluoride) excimer laser to selectively heat silicon nitride in the presence of other integrated circuit device materials for the purpose of annealing, densification, flowing to smooth the device topography or inducing compositional change in the silicon nitride. The method involves exposing the semiconductor device at various selected stages of its manufacturing cycle to a beam of high energy laser radiation. The laser is may produce a repetitively pulsed beam directed to a particular spot or may be utilized in a raster scanning mode over greater surface areas of silicon nitride. The laser method includes high thermal selection resulting in extremely sharp lateral and vertical thermal gradients. It results in improved etch, tensile stress and densification characteristics. The laser beam is characterised by extremely short, i.e., 193 nm wavelength permitting submicron lateral resolution and highly efficient laser gain over a large ($>4$ cm$^2$) area beam and high ($>50$ Hz) repetition frequency.

BRIEF DESCRIPTION OF THE DRAWING

The single FIGURE shows an ArF laser providing selective high energy radiation on a silicon nitride layer in a semiconductor device.

DETAILED DESCRIPTION

This invention is based upon the preferential absorption by silicon nitride to radiation of energy greater than the energy gap of the molecular structure. For stoichiometric silicon nitride, this corresponds to a wavelength of about 262 nanometers (nm). A radiation source of much shorter wavelength is necessary, however, since the attenuation depth must be comparable to the thickness of silicon nitride typically used in integrated circuit fabrication, i.e., $>100$ nm, so as to minimize heat conduction into underlying layers. It is of paramount importance, that the optical properties of the surrounding materials, i.e. silicon, silicon dioxide, and aluminum, are such that absorption coupling to the incident radiation be appreciably less than the silicon nitride, so that these materials remain relatively cool. At the wavelengths of interest, i.e., ≲220 nm, only an ArF excimer laser emitting at 193 nm, satisfies these stringent criteria. In addition, the extremely high efficiency, 2-3%, characteristic of excimer laser systems is particularly attractive for production requirements. Table I on page 7 compares the absorptivity, α, and the reflectivity, R, of the common integrated circuit device materials at 193 nm illustrating the preferential absorption characteristics of silicon nitride viz. the oxide is transparent, whereas the high reflectivity of both silicon, which is essentially invariant to doping densities, and aluminum, precludes any significant absorption coupling.

The single FIGURE illustrates a semiconductor device at a particular stage of its manufacture where it is desired to treat the silicon nitride portion of the device. Such portion is in close proximity i.e. abutting and overlying other portions of the device made from other materials such as the silicon substrate, silicon dioxide layers, phosphosilicate glass layers, boron or other doped regions and electrical interconnect structures made of aluminum or other materials. In the illustrated embodiment the semiconductor device shown is a MOS transistor having a silicon wafer substrate 10, doped N+ junction areas 11, a silicon oxide insulation layer 12, a polycrystalline-silicon gate 13, $Si_3N_4$ isolation layer 14 and aluminum interconnect layers 16 which extend in patterns on the overall device and connect to the operative parts of the transistor through etched vias 15 in the silicon oxide layer 12 and the silicon nitride layer 14. In the practice of the invention a laser beam 21 emitted from an ArF laser 20 is pulsed on the top of the device surface shown in the FIGURE. Resultant from such emission, energy is absorbed by the $Si_3N_4$ layer to cause densification of that layer. This operation may be done before or after an etching step to open the contact apertures or vias 15 and before the aluminum interconnect layers 16 are laid down. The silicon oxide layer is essentially transparent to the 193 nm wavelength beam, i.e., no coupling, while the poly-silicon and N+ doped areas have a high beam reflectivity so only a relatively small amount of energy is absorbed and those areas not unduly heated.

The excimer laser is of relatively high efficiency so that it is possible to process, e.g. densify, the entire surface of a 3-4 inch wafer with a single pulse. Multiple pulses may also be utilized over the entire wafer surface. Alternatively various raster scan modes may be used where the wafer is mounted on a stage movable in the X axis and Y axis in relation to a fixed laser beam or where the wafer is fixed and the laser beam collimated and reflected by X and Y galvanometer controlled mirrors and focused by a lens to impinge in raster X and Y movement across the wafer(s). An ArF laser is positioned above the device at a distance defined by the focal length of the focusing optics and is controllable to irradiate the device with a prescribed number of laser pulses with sufficient pulse energy (joules/$cm^{-2}$), pulse width (in nsec), repetition frequency (Hz) and over a multimode, i.e. scanned, spot size (mm). The irradiation is performed in an inert atmosphere, typically a flowing nitrogen blanket.

A laser which may be utilized in this invention comprises a Model TE-861 gas laser as manufactured by Lumonics of Kanata (Ottawa), Ontario, Canada. This is an argon-fluorine (ArF) active medium excimer laser in which the active mediums comprises 20% by volume argon and 0.5% fluorine in a helium buffer gas with a wavelength of emitted light of 193 nanometers. This laser may be operated, dependent on the thickness and location in the strata of the silicon nitride portion, in the pulse mode with a preferred range of pulse width of from about 1 to 20 nanoseconds (FWHM—full width at half maximum). This laser has a range of 0.1 to 10 joules of discharge energy emitted from the laser. The laser is operable in a scanning multi-mode typically providing a multi-spot beam pattern of a square cross section of 1 cm, at 0.1 to 10 cm/sec with an overlap of approximately 50%. The laser is powered at a repetition rate in a range of from about 1 to 100 Hz. The term "excimer" as used herein means a laser in which the active gas medium is a molecule that is stable in its excited state only, dissociating immediately after emission.

At the wavelengths of interest for treatment of silicon nitride i.e. ArF at 193 nm, metallization utilized for electrical interconnection between various regions of the device (typically comprising aluminum) and for contacts to semiconductor regions has exhibited reflecting losses greater than about 90%, so that essentially very little heat is generated in the metallizaton by the absorption of incident radiation. Also, the large thermal conductivity of metallization will act as a heat sink, preventing the metallization from exhibiting a significant rise in temperature due to the absorption of incident radiation or conduction of heat.

At these wavelengths, polycrystalline silicon, also commonly used for electrical interconnections, has a reflectivity of approximately 70% and an absorptivity of approximately $6 \times 10^5$ $cm^{-1}$. Thus, polycrystalline silicon will be heated to less than about 1100° C. upon application of laser energy to anneal silicon nitride in accordance with this invention, and the surrounding polycrystalline silicon will not be affected by this slight heating.

Metal silicides, such as tungsten silicide ($WSi_2$), tantalum silicide ($TaSi_2$) and molybdenum silicide ($MoSi_2$) are also utilized to form electrical interconnects in semiconductor devices. Such metal silicides exhibit a reflectivity of at least 60% to laser energy having wavelengths within the above range, and thus are substantially unaffected by exposure to laser radiation utilized for silicon nitride annealing, provided this radiation is of short duration (as is the case when the laser energy is applied to a semiconductor device for the purpose of annealing silicon nitride).

Absorption of energy from the ArF laser beam by silicon nitride occurs because the energy is greater than the band gap of silicon nitride. The optical properties of the various components of an integrated circuit being irradiated at 193 nm are seen in the following table:

|  | $Si_3N_4$ | $SiO_2$ | Si | Al |
|---|---|---|---|---|
| α ($cm^{-1}$) | $2 \times 10^5$ | 0.00 | $6 \times 10^5$ | — |
| R | 0.20 | — | 0.65 | 0.91 | where α is the absorptivity and R is the reflectivity.

As an example, consider an 83.5 nm thick film of silicon nitride formed by chemical vapor deposition at 850° C. on p-<100> silicon. The as-deposited film has a refractive index of 1.98 at λ=0.6328 μm, a tensile stress of $11.1 \times 10^9$ dyne $cm^{-2}$, and an etch rate in concentrated HF of 24 nm/min.$^{-1}$. The film is then irradiated with four successive pulses from an ArF excimer laser at 193 nm with the following operating characteristics: pulse energy of 0.28 J cm$^{-2}$; pulse width of 10 nsec FWHM; repetition frequency of 10 Hz; and multimode spot size of 3×8 mm$^2$. The irradiation was done under a flowing nitrogen blanket. Subsequent characterization of the film showed that the thickness decreased by 2.2, nm the refractive index increased to 2.02, the tensile stress was reduced to 9.5×10$^9$ dyne cm$^{-2}$, and the etch rate in concentrated HF was now 16 nm min.$^{-1}$. These results show clearly that some densification of the film occurred as a result of the laser irradiation. Nomarski photomicrographs of the surface of the nitride suggest that some flow or melting may have occurred. By way of comparison, furnace annealing in dry N$_2$ for 30 min. at 950° C. is required to bring about a similar reduction in the tensile stress and etch rate to that resulting from the laser treatment with the ArF laser and without any change in surface roughness.

It is to be understood that although an MOS structure is shown in the illustration of the present process, such process can readily be used in bipolar structures.

Through the use of a laser as described above, it will also be seen that extremely small areas can be made to flow as desired dependent on the laser beam cross-section.

While the invention has been described in terms of Si$_3$N$_4$ other silicon nitride compounds, such as oxynitride (Si$_3$N$_4$)$_x$(SiO$_2$)$_{x-1}$ where x≧0.9, may be employed where a Si:N bond is present. The method is invariant to the process of forming the nitride layer which can be formed by chemical vapor deposition (CVD), thermal nitridation, plasma assisted thermal nitridation, sputtering or plasma CVD.

The above description of embodiments of this invention is intended to be illustrative and not limiting. Other embodiments of this invention will be obvious to those skilled in the art in view of the above disclosure.

I claim:

1. The method of inducing annealing, flow or densification in a silicon nitride portion of a semiconductor device structure covered at least partly by other portions of said device made of other non-silicon nitride materials, wherein annealing, flow or densification is induced on said silicon nitride portion upon application of heat thereto, comprising applying a laser beam to said silicon nitride portion wherein said laser beam is an ArF excimer laser beam having an emission wavelength which is approximately equal to the wavelength most absorbed by the silicon nitride portion and not of a wavelength most absorbed by said other portions.

2. The method of claim 1 in which said beam is applied as a repetitively pulsed beam.

3. The method of claim 1 in which said laser beam has a wavelength of 193 nm.

4. The method of claim 1 in which said semiconductor device structure is a transistor.

5. The method of claim 1 in which said other portions are either transparent to said beam or are of high reflectivity so as to preclude absorption coupling with said beam.

6. The method of claim 5 in which said other portions are silicon oxide, silicon and aluminum.

7. The method of claim 1 in which said beam is applied in the form of intermittent pulses of from 0.1 to 10 joules of discharge energy.

8. The method of claim 1 in which said laser beam is generated by an excimer laser powered at a repetition rate of from about 1 to 100 Hz.

9. The method of claim 1 wherein said other portions are heated to less than about 1100° C.

10. The method of claim 1 in which said silicon nitride is (Si$_3$N$_4$)$_x$(SiO$_2$)$_{x-1}$ where x>0.9.

11. The method of claim 1 including depositing said silicon nitride portion on a substrate; depositing on said silicon nitride portion a non-silicon nitride material which largely transmits radiation from said ArF excimer laser beam; and then applying said laser beam to said silicon nitride portion through said non-silicon nitride material.

12. The method of claim 1 including depositing said silicon nitride portion on a substrate; depositing on said silicon nitride portion a non-silicon nitride material which largely reflects radiation from said ArF excimer laser beam; and then applying said laser beam to said silicon nitride portion adjacent said non-silicon nitride material.

13. The method of claim 1 including depositing said silicon nitride portion on a substrate; depositing on said silicon nitride portion non-silicon nitride materials which largely transmit or reflect radiation from said ArF excimer laser beam; and then applying said laser beam to said silicon nitride portion adjacent said non-silicon nitride material.

* * * * *